(12) United States Patent
Hanawa et al.

(10) Patent No.: US 7,292,428 B2
(45) Date of Patent: Nov. 6, 2007

(54) ELECTROSTATIC CHUCK WITH SMART LIFT-PIN MECHANISM FOR A PLASMA REACTOR

(75) Inventors: Hiroji Hanawa, Sunnyvale, CA (US); Andrew Nguyen, San Jose, CA (US); Kenneth S. Collins, San Jose, CA (US); Kartik Ramaswamy, San Jose, CA (US); Biagio Gallo, Los Gatos, CA (US); Amir Al-Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 279 days.

(21) Appl. No.: 11/115,951

(22) Filed: Apr. 26, 2005

(65) Prior Publication Data

US 2006/0238953 A1    Oct. 26, 2006

(51) Int. Cl.
*H02N 13/00* (2006.01)
(52) U.S. Cl. ..................................... 361/234
(58) Field of Classification Search ................. 361/234
See application file for complete search history.

(56) References Cited

U.S. PATENT DOCUMENTS

| | | | | |
|---|---|---|---|---|
| 5,325,261 A | 6/1994 | Horwitz | ...................... | 315/234 |
| 5,491,603 A | 2/1996 | Birang et al. | ................ | 361/234 |
| 5,677,824 A * | 10/1997 | Harashima et al. | ......... | 361/234 |
| 5,684,669 A | 11/1997 | Collins et al. | .............. | 361/234 |
| 5,872,694 A | 2/1999 | Hoinkis et al. | ............. | 361/234 |
| 5,956,837 A | 9/1999 | Shiota et al. | ................. | 29/559 |
| 6,307,728 B1 | 10/2001 | Leeser | ........................ | 361/234 |
| 6,395,150 B1 | 5/2002 | Van Cleemput et al. | ..................... | 204/192.37 |
| 6,413,321 B1 | 7/2002 | Kim et al. | .................. | 118/725 |
| 6,430,022 B2 | 8/2002 | Leeser | ........................ | 361/234 |
| 6,646,857 B2 | 11/2003 | Anderson et al. | ........... | 361/234 |
| 6,898,064 B1 * | 5/2005 | Berman et al. | ............. | 361/234 |
| 6,938,505 B2 * | 9/2005 | Chen et al. | ................. | 73/865.9 |
| 2003/0013260 A1 | 1/2003 | Gossman et al. | ........... | 438/301 |
| 2003/0085205 A1 | 5/2003 | Lai et al. | ................ | 219/121.43 |

FOREIGN PATENT DOCUMENTS

| | | |
|---|---|---|
| EP | 1 158 071 A2 | 11/2001 |
| JP | 070455542 | 2/1995 |
| JP | 2000150908 | 5/2000 |

OTHER PUBLICATIONS

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

* cited by examiner

*Primary Examiner*—Ronald W. Leja
(74) *Attorney, Agent, or Firm*—Law Office of Robert M. Wallace

(57) ABSTRACT

A lift pin assembly for use in a reactor for processing a workpiece includes plural lift pins extending generally parallel with a lift direction, each of the plural lift pins having a top end for supporting a workpiece and a bottom end. A lift table faces the bottom ends of the pins and is translatable in a direction generally parallel with the lift direction. A small force detector senses a force exerted by the lift pins that is sufficiently large to indicate a chucked wafer and sufficiently small to avoid dechucking a wafer. A large force detector senses a force exerted by the lift pins in a range sufficient to de-chuck the wafer.

20 Claims, 3 Drawing Sheets

ELECTROSTATIC CHUCK WITH SMART LIFT-PIN MECHANISM FOR A PLASMA REACTOR

BACKGROUND OF THE INVENTION

An electrostatic chuck can be employed in a plasma reactor chamber to hold a semiconductor wafer onto a wafer support surface within the chamber during plasma processing of the wafer. The electrostatic chuck consists of a flat electrode or conductive grid insulated by a flat insulating or semi-insulating layer over which the wafer is placed. Typically, thin lift pins extend upwardly through the electrostatic chuck to receive the wafer above the electrostatic chuck from a robotic device which is then retracted. The lift pins are then retracted downwardly until the wafer rests on the wafer support surface. A large D.C. chucking voltage is applied to the electrode, typically with respect to a chamber wall ground. The wafer is typically referenced to ground indirectly through the plasma. The application of the large DC voltage to the electrostatic chuck electrode with the plasma "on" produces a large electrostatic force that holds the wafer in place. Plasma processing of the wafer is then performed, after which the lift pins extend upwardly to lift the wafer from the electrostatic chuck to the robot device for removal from the chamber. For high throughput, the lift pins are moved at a relatively high speed during their downward retraction and upward extension motions. The removal of the applied D.C. chucking voltage does not necessarily eliminate the potential difference between the wafer being chucked and the surface of the electrostatic chuck. Residual charge can remain, resulting in an residual attractive force between wafer and chuck. Depending on the magnitude of the residual force and the velocity of the lift pins during their upward extension, the wafer may be broken.

Lifting the pins when the plasma is "on" provides a discharge path for the current caused by the separation of the wafer from the chuck, but if the residual force is large, the wafer may still break.

Some prior art methods use the gas flow rate of a heat transfer gas (such as helium) delivered to the surface of the electrostatic chuck at constant pressure as a measure of residual chucking force. This method generally fails when some portion of the wafer "dechucks", allowing the heat transfer gas to leak out at high flow rate, while another portion of the wafer remains chucked and may be broken in a subsequent upward motion of the lift pins.

Currently, there is no way to detect occurrence of such an error prior to destruction of the wafer.

A related problem is that process failure (due to excessive heating or poor temperature control) may occur if the wafer is not securely chucked to the wafer support surface prior to the start of plasma processing in the chamber. Currently, there is no way of confirming the adequacy of the chucking force prior to the start of plasma processing of the wafer without supplying a heat transfer gas (such as helium) to the surface of the electrostatic chuck at constant pressure and monitoring the gas flow rate as a measure of residual chucking force. However for some applications, in particular at high-bias-voltage, heat transfer gases may break down electrically, causing the wafer to dechuck and potentially destroying the wafer and electrostatic chuck. A method of confirming the adequacy of the chucking force prior to processing is required.

SUMMARY OF THE INVENTION

A lift pin assembly for use in a reactor for processing a workpiece includes plural lift pins extending generally parallel with a lift direction, each of the plural lift pins having a top end for supporting a workpiece and a bottom end. A lift table faces the bottom ends of the pins and is translatable in a direction generally parallel with the lift direction. A small force detector senses a force exerted by the lift pins that is sufficiently large to indicate a chucked wafer and sufficiently small to avoid dechucking a wafer A large force detector senses a force exerted by the lift pins in a range sufficient to de-chuck the wafer.

DETAILED DESCRIPTION OF THE INVENTION

Figure 1:
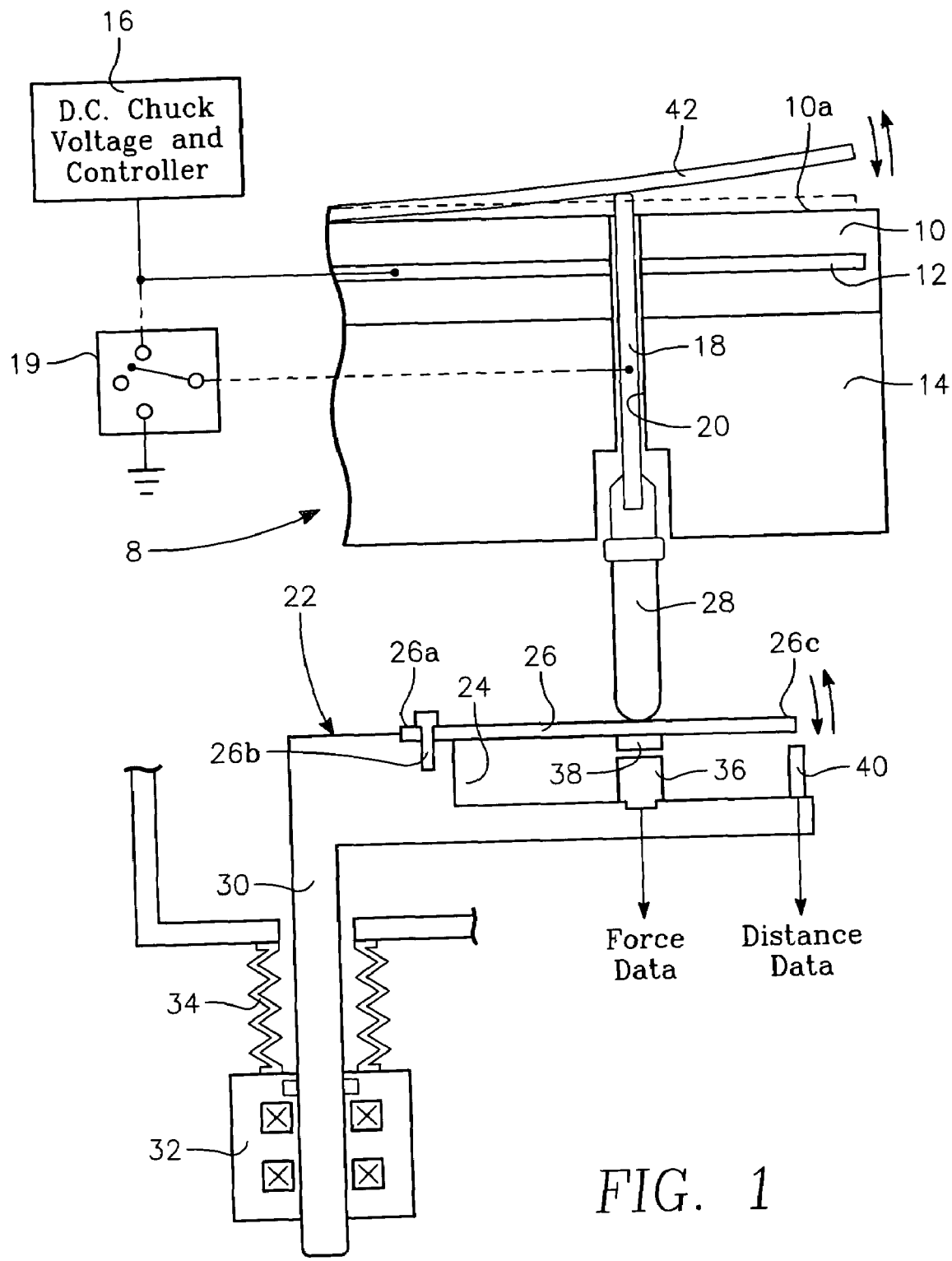
FIG. 1 depicts a lift pin assembly embodying the invention.

Referring to FIG. 1, an electrostatic chuck (ESC) 8 consists of an insulating or semi-insulating layer 10 encapsulating a thin planar chucking electrode or conductive grid 12, the top surface 10*a* of the insulating surface forming a wafer support surface. The insulating layer 10 may be aluminum nitride, for example, and is supported on an ESC base 14. A D.C. chucking voltage supply and controller 16 is coupled to the chucking electrode 12. At least three lift pins 18 extending through holes 20 in the ESC 8 are supported on an axially translatable lift table 22. For each lift pin 18, the lift table 22 has a recess 24 covered by an elastic spring plate 26 that is held onto the lift table at one end 26*a* by a fastener 26*b*. The other end 26*c* of the spring plate 26 is free to deflect axially. Optionally, an insulating (e.g., ceramic) fitting 28 on the bottom end of the lift pin 18 supports the lift pin 18 on the lift table 22. The lift table 22 is cantilevered from the top end of an axial piston 30 that is axially translated by a lift servo motor assembly 32. Bellows 34 maintain a vacuum seal of the chamber interior while allowing up and down motion by the lift table 22.

A conventional strain gauge 36 is fastened on the surface of the lift table 22 inside the recess 24 facing the bottom side of the spring plate. A foot 38 fastened to the bottom of the spring plate 22 faces and overlies the strain gauge 36. A conventional optical detector 40 fastened to the surface of the lift table within the recess 24 acts as a proximity detector, sensing the axial deflections of the free end 26*c* of the spring plate 26. As each lift pin 18 pushes against a wafer 42, the downward force imparted by the lift pin 18 deflects the spring plate 26, moving the spring plate free end 26*c* downwardly so that the foot 38 pushes against the strain gauge 36 with ever increasing force. The proximity detector 40 measures the resulting downward deflection of the spring plate free end 26*c*. If lift pin 18 pushes against the wafer 42 while a chucking voltage is applied to the electrode 12, then the wafer will resist the upward motion of each lift pin 18, causing the wafer 42 to bend upwardly near its periphery, as shown in FIG. 1. The force required to deflect the wafer in this manner is measured by the strain gauge 36 from the pressure exerted against it by the ceramic lift pin holder 28. The magnitude of the resulting downward deflection by the spring plate is measured by the proximity detector 40. The strain gauge 36 acts as a high force sensor capable of measuring forces sufficient to de-chuck a wafer after removal of the D.C. chucking voltage from the chucking electrode. The combination of the spring plate and proximity sensor acts as a high resolution low force sensor for sensing a "sub-de-chucking" force sufficiently small to avoid de-chucking the wafer (up to several times the weight of a wafer, or several hundred grams equivalent force for a 300 mm diameter Si wafer). Such a sensor is useful for measuring a lifting force imposed by the lift pins that is sufficient to indicate the presence of a chucking force but which avoids de-chucking the wafer.

In alternative embodiments, sensors other than the types disclosed above may perform as the low force sensor and the high force sensor. Such a sensor may be provided for each lift pin 18. Such sensors are in the lift pin 18 or coupled to the lift pin 18. Moreover, a single sensor may serve as both the high force sensor and the low force sensor for a given lift pin 18.

In another alternative embodiment, at least one or all of the lift pins 18 may be formed of a semiconductor material (e.g., crystalline or polycrystalline silicon or germanium) or of a conductor (e.g., aluminum). In such a case, a switch 19 may be provided with which the conductive or semiconductive lift pin(s) 18 may be connected to any one of the following at selected times: ground potential, a an electrically floating potential, the ESC electrode 12. The switch 19 may be employed during wafer chucking and wafer dechucking operations to enhance the control of the D.C. wafer voltage. During plasma processing of the wafer, the switch 19 would be set to connect the lift pin(s) 18 to the floating potential.

Figure 2:
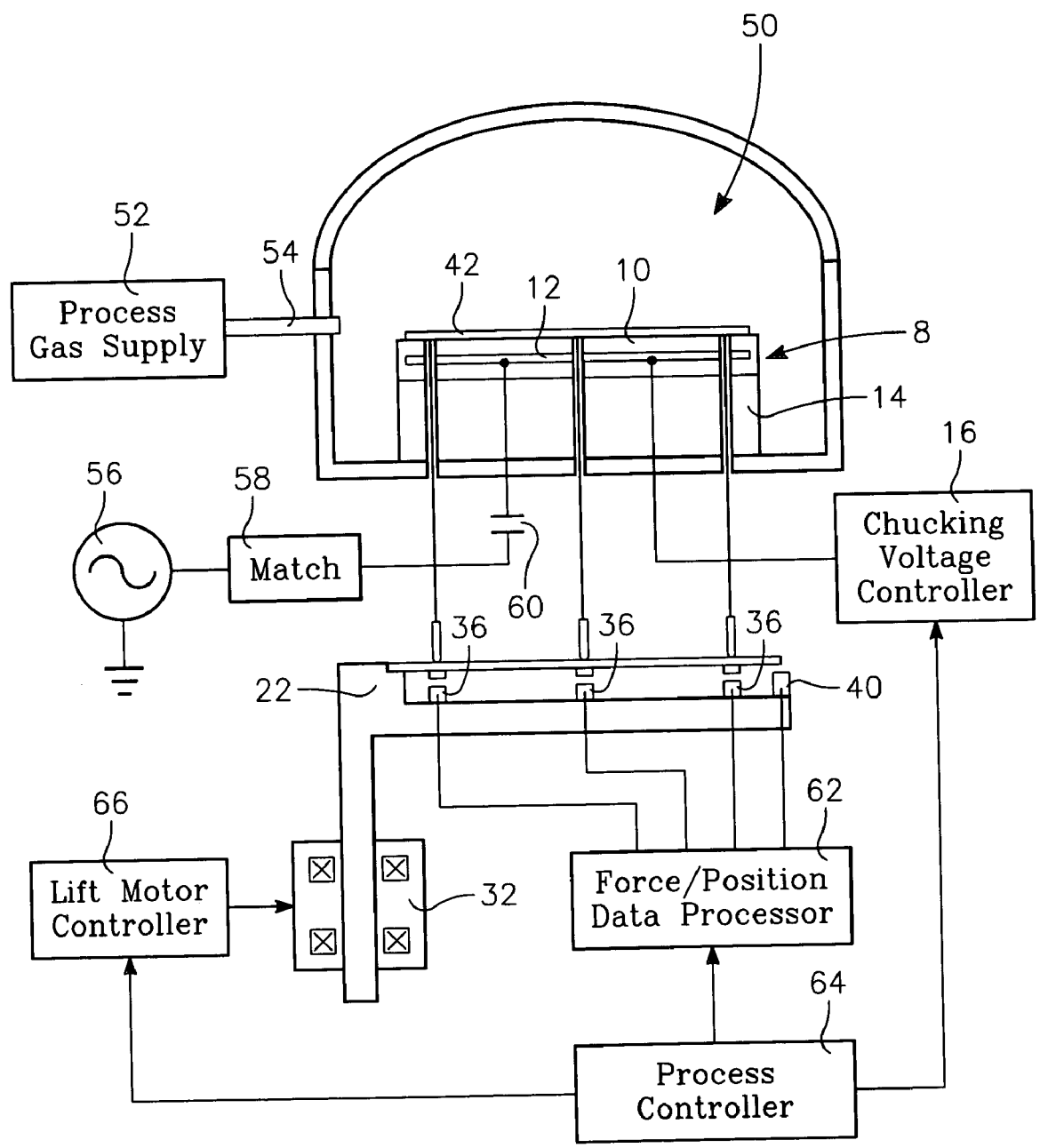
FIG. 2 depicts a plasma reactor incorporating the lift pin assembly of FIG. 1.

FIG. 2 illustrates a plasma reactor including a system for exploiting the apparatus of FIG. 1. The reactor includes a chamber 50, a process gas supply 52 and gas distributor 54 and an RF power generator 56 coupled through an impedance match circuit 58 to (for example) the ESC electrode 12 through a D.C.-blocking capacitor 60. A processor 62 uses the force measurements from the strain gauge 36 and the deflection measurements from the proximity sensor 40 to provide actual force data and deflection data. A process controller 64 uses the force data and the deflection data to control the D.C. chuck voltage delivered by the controller 16 and to control the lift table motor assembly 32 through a lift assembly motor controller 66.

Figure 3:
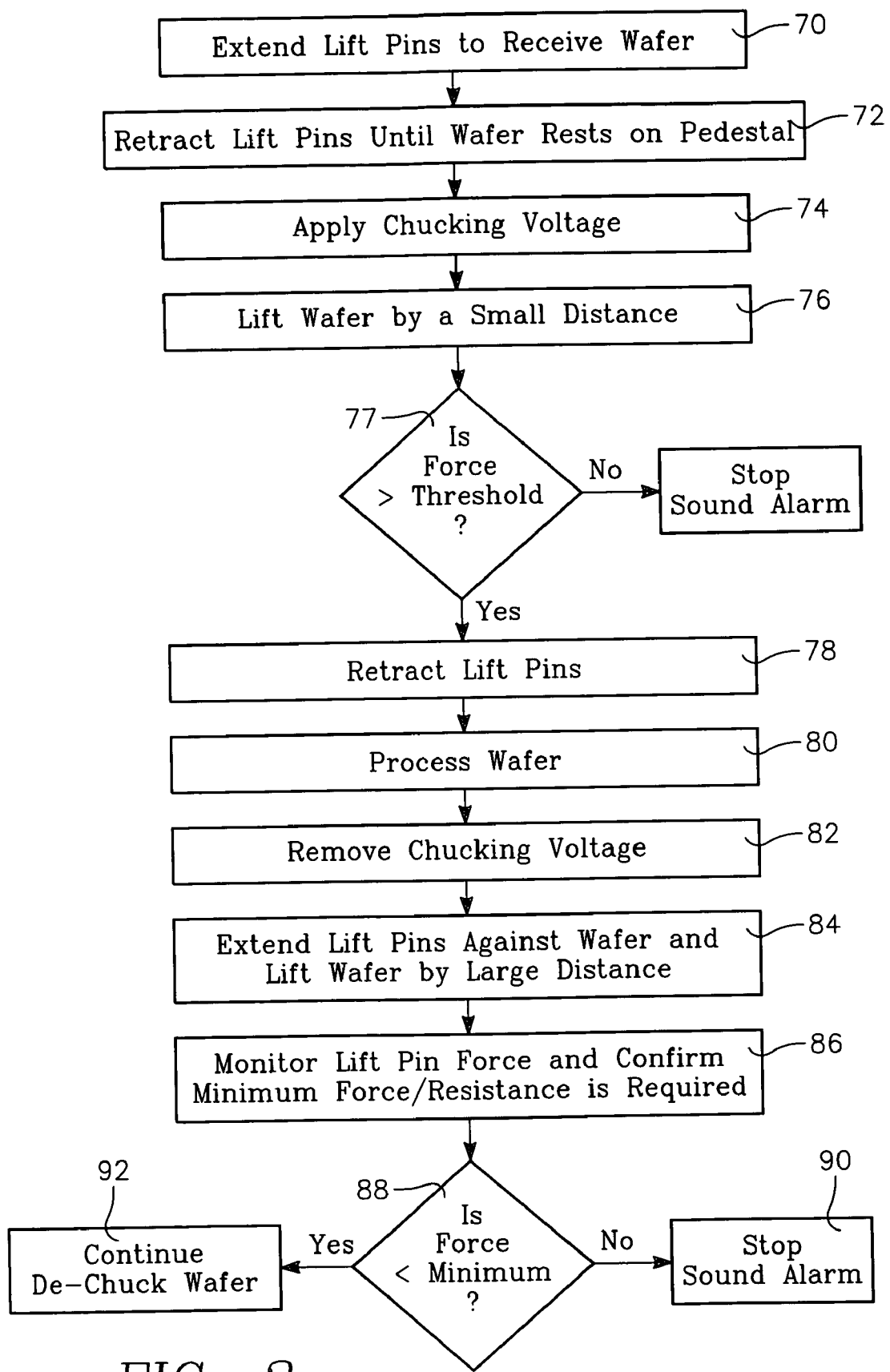
FIG. 3 depicts a wafer chucking and de-chucking process for the plasma reactor of FIG. 2.

Operation of the process controller 64 is illustrated in FIG. 3. First the controller 64 causes the lift pins 18 to extend above the wafer support surface to receive the wafer from a robotic arm (not shown) in the step of block 70 of FIG. 3. The controller 64 then causes the lift pins 18 to retract so as to lay the wafer on the wafer support surface of the ESC 8 (block 72). Gas is introduced and RF power is applied to initiate a plasma, which indirectly references the wafer to a reference ground. Preferably, plasma source power is used for initiating the plasma for wafer chucking, but bias power may also be used. If bias power is used for initiating the plasma for wafer chucking, then preferably a low RF voltage is applied. The controller 64 then causes a D.C. chucking voltage to be applied to the ESC electrode 12 (block 74) with respect to the reference ground (typically a chamber wall). (Alternatively, the voltage is first applied and then RF power is applied to initiate a plasma.) After a typically short time delay, the wafer chucking is then tested by extending the lift pins 18 against the chucked wafer and then extending them a small distance (e.g., 0.2- about 1 mm) to deform the wafer by 0.2- about 1 mm (block 76). The deflection of the spring plate 26 sensed by the proximity detector 40 is then used by the data processor 62 to determine whether the lift pin force is at least a small threshold force (e.g., a few hundred grams equivalent force). If the force is above the threshold level (YES branch of block 77), the wafer has been successfully chucked and the process controller 64 causes the lift pins to be withdrawn from wafer (block 78) and plasma processing of the wafer is performed (block 80). (Alternatively, the wafer chucking may be continuously tested by maintaining the lift pins in position and continuously monitoring the force.) Otherwise (NO branch of block 77), an alarm is displayed and/or the chucking process is repeated. After wafer processing, the controller 64 causes the chucking voltage to be turned off (block 82) or may be set to a "dechucking" voltage. This "dechucking" voltage may be zero volts, or may be set to a non-zero value which is selected to minimize the residual electric field between wafer and chuck surface caused by residual charge on the surfaces. Preferably, the plasma is on during the dechuck operation to provide a discharge path from the wafer. Preferably, plasma source power is applied for the dechuck operation, but bias power may be used. Preferably the RF voltage on the wafer is low during the dechuck operation. After a time delay, the controller 64 then causes the lift pins 18 to extend upwardly to contact the wafer and then continue further until the lift pins travel a larger distance (e.g., 3 mm) to deflect the wafer by that larger distance (block 84). The output of the force sensor is monitored (block 86) to ensure that the force sensor output, which increases as the residual charge force is met, finally returns to zero (signifying successful dechucking) by or before the lift pins have traveled the larger (3 mm) distance after contacting the wafer. If the sensed force does reach approximately zero after the lift pins have traveled the larger distance (3 mm), the wafer has been successfully dechucked (YES branch of block 88), and the controller 64 causes the lift pins to extend the full distance required (e.g., about 25 mm) to return the wafer to the robot mechanism for removal (block 92). If the sensed force has not returned to zero (neglecting the weight of the wafer) at this point (NO branch of block 88), then an alarm is sounded to halt the wafer removal process (to avoid wafer breakage) until the chucking force or voltage can be thoroughly removed (block 90).

In an alternative embodiment, after wafer processing, the controller 64 causes the chucking voltage to be turned off (block 82) or may be set to an initial "dechucking" voltage. Preferably, the plasma is on during the dechuck operation to provide a discharge path from the wafer. Preferably, plasma source power is applied for the dechuck operation, but bias power may be used. Preferably the RF voltage on the wafer is low during the dechuck operation. After a time delay, the controller 64 then causes the lift pins 18 to extend upwardly to contact the wafer and then continue further until the lift pins travel a larger distance (e.g., 3 mm) to deflect the wafer by that larger distance (block 84). The output of the force sensor is monitored (block 86). In accordance with this alternative embodiment, during the monitoring step of block 86, the "dechucking" voltage is stepped or ramped through a range of "dechucking" voltages in order to find the ideal de-chucking voltage to compensate for any remnant charge that would otherwise prevent the sensed force from decreasing to the predetermined minimum. When the force sensor output finally decreases to the minimum or returns to zero (signifying successful dechucking—YES branch of block 88) the dechucking voltage is set to zero volts, and the controller 64 causes the lift pins to extend the full distance required (e.g., about 25 mm) to return the wafer to the robot mechanism for removal (block 92). If the sensed force has not returned to zero at this point, then an alarm is sounded to halt the wafer removal process (to avoid wafer breakage) until the chucking force or voltage can be thoroughly removed (block 90). However, because the dechucking voltage is ramped during the monitoring step of block 86 in this alternative embodiment, the probability of resorting to the alarm of block 90 is reduced.

In a preferred embodiment, the controller 64 acts as a feedback loop continuously controlling the upward motion of the lift pins. If the pin force does not fall to a minimum value (e.g., zero) by the time the lift pins have pushed the wafer the large distance (e.g., 3 mm), then the controller 64 immediately halts the pin movement to avoid wafer breakage. This allows the lift pin upward motion to be continuous provided that the lift pin force falls to the minimum level within the required lift pin travel distance.

Optionally, conductive or semi-conductive lift pins may be used to help discharge the wafer-chuck capacitance and facilitate the dechucking operation. The pins may be directly connected to a reference ground or to the isolated electrostatic chuck electrode. Alternatively and preferably, the pins may be switched to be connected to a reference ground or to the isolated electrostatic chuck electrode just when dechucking or chucking, but can remain isolated in normal processing.

In the case of an alarm condition, the controller may optionally re-try a dechucking operation.

The foregoing thus requires two force sensors, namely one capable of measuring a small force (e.g., a few hundred grams) that can be exerted against the wafer to confirm successful chucking without dechucking the wafer, and one capable of measuring a large force (e.g., about 50 kg) sufficient to overcome residual charge-induced force to de-chuck the wafer. In the embodiment of FIG. 1, the low-force sensor is a spring plate and proximity sensor, while the high-force sensor is the strain gauge sensor. However, both sensors may be of the same type, provided both operate with sufficient accuracy within their respective ranges. Moreover, if a single sensor suffices to cover both force levels (200 grams for the low force and 50 kg for the high force), then the foregoing procedure can be carried out using the single sensor rather than two sensors.

While the above specification describes an example of a single-electrode (monopolar) chuck, the apparatus and method may also be applied to bipolar or multipolar chucks.

While the invention has been described in detail by specific reference to preferred embodiments, it is understood that variations and modifications thereof may be made without departing from the true spirit and scope of the invention.

What is claimed is:

1. A lift pin assembly for use in a reactor for processing a workpiece, said lift pin assembly comprising:
    plural lift pins extending generally parallel with a lift direction, each of said plural lift pins having a top end for supporting a workpiece and a bottom end;
    a lift table translatable in a direction generally parallel with said lift direction;
    a first lift pin force detector for an individual first one of said lift pins, comprising:
        (a) an elastic plate having one end attached to said lift table and an opposite end, said elastic plate supporting the bottom end of said first one of said lift pins;
        (b) a small force detector responsive to a deflection of said elastic plate for sensing a force exerted by said first one lift pin that is sufficiently large to indicate a chucked wafer and sufficiently small to avoid dechucking a wafer; and
        (c) a large force detector responsive to a force exerted on said elastic plate by said first one lift pin in a range sufficient to de-chuck the wafer.

2. The apparatus of claim 1 wherein said small force detector comprises:
    a proximity detector.

3. The apparatus of claim 1 further comprising a lift motor for raising and lowering said lift table along said lift direction.

4. The apparatus of claim 2 further comprising a data processor for converting outputs of said proximity detector and said large force detector into a position value and a force value, respectively.

5. The apparatus of claim 2 wherein said opposite end of said elastic plate is unattached and said elastic plate extends from said one end to said unattached opposite end in a direction transverse to said lift direction, and wherein said proximity detector is aligned to detect the position of said unattached opposite end of said elastic plate.

6. The apparatus of claim 5 wherein the bottom end of said one lift pin is aligned with an intermediate region of said elastic plate that is between said one end and said unattached opposite end of said elastic plate.

7. The apparatus of claim 6 wherein said large force detector comprises a force sensor underlying said intermediate portion of said elastic plate and being in registration with said bottom end of said one lift pin.

8. The apparatus of claim 1 further comprising a second lift pin force detector for a second one of said lift pins, comprising:
    (a) an elastic plate having one end attached to said lift table and an opposite end, said elastic plate supporting the bottom end of a second one of said lift pins;
    (b) a small force detector responsive to a position of said elastic plate for sensing a force exerted by said second lift pin that is sufficiently large to indicate a chucked wafer and sufficiently small to avoid dechucking a wafer; and
    (c) a large force detector responsive to a force exerted on said elastic plate by second lift pin in a range sufficient to dechuck the wafer.

9. A workpiece support in a plasma reactor, comprising:
    an insulating or semi-insulating layer having a wafer support surface defining a wafer support plane;
    a wafer chucking electrode inside said insulating or semi-insulating layer;
    plural lift pin holes extending through said insulating or semi-insulating layer in a lift direction transverse to said wafer support plane;
    plural lift pins extending through said plural lift pin holes, each of said plural lift pins having opposing top and bottom ends and being translatable along said lift direction, said top ends for supporting a workpiece above said wafer support plane;
    a lift table translatable in a direction generally parallel with said lift direction;
    respective lift pin force detectors for respective ones of said lift pins, each of said respective lift pin force detectors comprising:
        (a) an elastic plate having one end attached to said lift table and an opposite end, said elastic plate supporting the bottom end of a respective one of said lift pins;
        (b) a small force detector responsive to a position of said elastic plate for sensing a force exerted by said respective lift pin that is sufficiently large to indicate a chucked wafer and sufficiently small to avoid dechucking a wafer; and (c) a large force detector responsive to a force exerted on said elastic plate by said respective lift pin in a range sufficient to de-chuck the wafer.

10. The apparatus of claim 9 wherein said small force detector comprises:

a proximity detector.

11. The apparatus of claim 9 further comprising a D.C. chucking voltage source coupled to said chucking electrode.

12. The apparatus of claim 9 further comprising a lift motor for raising and lowering said lift table along said lift direction.

13. The apparatus of claim 9 further comprising a data processor for converting outputs of said small force detector and said large force detector into respective force values.

14. The apparatus of claim 10 wherein said opposite end of said elastic plate is unattached, said elastic plate extending from said one end to said unattached opposite end in a direction transverse to said lift direction, and wherein said proximity detector is aligned to detect the position of said unattached opposite end of said elastic plate.

15. The apparatus of claim 14 wherein the bottom end of said one lift pin is aligned with an intermediate region of said elastic plate that is between said one end and said unattached opposite end of said elastic plate.

16. The apparatus of claim 9 further comprising a processor coupled separately to each of said respective lift pin force detectors.

17. The apparatus of claim 9 wherein said large force detector and said small force detector are responsive to an intermediate portion of said elastic plate and said opposite end of said elastic plate, respectively.

18. The apparatus of claim 9 wherein at least one of said lift pins is formed of a material that is either semiconductive or conductive.

19. The apparatus of claim 18 further comprising a contact switch coupled to the at least one of said lift pins and having at least two of the following contacts: (a) ground potential, (b) said wafer chucking electrode, (c) a floating potential or open state.

20. A method of operating a wafer support including a wafer chucking electrode and a set of lift pins supported by a lift table, said method comprising:

after the wafer has been placed on the wafer support and prior to processing the wafer, ascertaining whether the wafer has been successfully chucked by contacting the wafer with the lift pins and then raising the lift pins by a sufficiently small distance so as to avoid dechucking the wafer if chucked while confirming the presence of a nominal electrostatic chucking force through a small force sensor coupled at a bottom end of one of said lift pins; and after the wafer has been processed, lifting the wafer from the wafer support with the lift pins while determining through a large force sensor whether the force exerted by the lift pins against the lift table falls to a minimum or zero before the lift pins have lifted the wafer by a predetermined distance that is sufficiently large to dechuck the wafer if the electrostatic chucking force has been removed but sufficiently small to avoid wafer breakage in the event the electrostatic chucking force has not been removed.

* * * * *